(12) United States Patent
Chen et al.

(10) Patent No.: US 11,201,281 B2
(45) Date of Patent: Dec. 14, 2021

(54) METHOD FOR FORMING A FLAT BOTTOM ELECTRODE VIA (BEVA) TOP SURFACE FOR MEMORY

(71) Applicant: Taiwan Semiconductor Manufacturing Co., Ltd., Hsin-Chu (TW)

(72) Inventors: Hsia-Wei Chen, Taipei (TW); Chih-Yang Chang, Yuanlin Township (TW); Chin-Chieh Yang, New Taipei (TW); Jen-Sheng Yang, Keelung (TW); Sheng-Hung Shih, Hsinchu (TW); Tung-Sheng Hsiao, New Taipei (TW); Wen-Ting Chu, Kaohsiung (TW); Yu-Wen Liao, New Taipei (TW); I-Ching Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/939,583

(22) Filed: Jul. 27, 2020

(65) Prior Publication Data

US 2020/0357981 A1 Nov. 12, 2020

Related U.S. Application Data

(60) Continuation of application No. 16/552,169, filed on Aug. 27, 2019, now Pat. No. 10,763,426, which is a (Continued)

(51) Int. Cl.
*H01L 43/02* (2006.01)
*H01L 23/538* (2006.01)
(Continued)

(52) U.S. Cl.
CPC ............ *H01L 43/02* (2013.01); *H01L 21/768* (2013.01); *H01L 23/5384* (2013.01);
(Continued)

(58) Field of Classification Search
CPC ..... H01L 27/2436; H01L 27/24; H01L 43/08; H01L 23/5226; H01L 27/222;
(Continued)

(56) References Cited

U.S. PATENT DOCUMENTS 6,086,777 A 7/2000 Cheng et al.
2006/0094236 A1 5/2006 Elkins et al.
(Continued)

FOREIGN PATENT DOCUMENTS

KR 20060074757 A 7/2006

OTHER PUBLICATIONS

Non-Final Office Action dated Jul. 29, 2019 for U.S. Appl. No. 15/823,012.
(Continued)

*Primary Examiner* — Changhyun Yi
(74) *Attorney, Agent, or Firm* — Eschweiler & Potashnik, LLC

(57) ABSTRACT

Various embodiments of the present application are directed towards a method for forming a flat via top surface for memory, as well as an integrated circuit (IC) resulting from the method. In some embodiments, an etch is performed into a dielectric layer to form an opening. A liner layer is formed covering the dielectric layer and lining the opening. A lower body layer is formed covering the dielectric layer and filling a remainder of the opening over the liner layer. A top surface of the lower body layer and a top surface of the liner layer are recessed to below a top surface of the dielectric layer to partially clear the opening. A homogeneous upper body layer is formed covering the dielectric layer and partially
(Continued)

filling the opening. A planarization is performed into the homogeneous upper body layer until the dielectric layer is reached.

20 Claims, 11 Drawing Sheets

Related U.S. Application Data division of application No. 15/823,012, filed on Nov. 27, 2017, now Pat. No. 10,566,519.

(60) Provisional application No. 62/547,230, filed on Aug. 18, 2017.

(51) Int. Cl.
| | | |
|---|---|---|
| *H01L 43/12* | (2006.01) | |
| *H01L 27/22* | (2006.01) | |
| *H01L 45/00* | (2006.01) | |
| *H01L 21/768* | (2006.01) | |
| *H01L 27/24* | (2006.01) | |
| *H01L 43/08* | (2006.01) | |

(52) U.S. Cl.
CPC ........ *H01L 27/228* (2013.01); *H01L 27/2436* (2013.01); *H01L 43/08* (2013.01); *H01L 43/12* (2013.01); *H01L 45/04* (2013.01); *H01L 45/1253* (2013.01); *H01L 45/16* (2013.01); *H01L 45/146* (2013.01)

(58) Field of Classification Search
CPC ......... H01L 21/76816; H01L 21/76877; H01L 27/11582; H01L 27/2481
See application file for complete search history.

(56) References Cited

U.S. PATENT DOCUMENTS

| | | |
|---|---|---|
| 2011/0101523 A1 | 5/2011 | Hwang et al. |
| 2011/0233696 A1 | 9/2011 | Li |
| 2013/0270703 A1 | 10/2013 | Zierath et al. |
| 2014/0063913 A1* | 3/2014 | Kawashima ........ G11C 13/0069 365/148 |
| 2014/0175369 A1 | 6/2014 | Murase et al. |
| 2014/0183738 A1 | 7/2014 | Jezewski et al. |
| 2015/0123278 A1 | 5/2015 | Park et al. |
| 2015/0137325 A1 | 5/2015 | Hong et al. |
| 2015/0263279 A1* | 9/2015 | Hayakawa .......... H01L 27/2436 257/4 |
| 2017/0047375 A1 | 2/2017 | Kanaya |
| 2017/0053167 A1 | 2/2017 | Ren et al. |
| 2017/0117467 A1 | 4/2017 | Chang et al. |
| 2018/0158728 A1* | 6/2018 | Chu ........................ H01L 43/02 |

OTHER PUBLICATIONS

Notice of Allowance dated Nov. 22, 2019 for U.S. Appl. No. 15/823,012.
Notice of Allowance dated Apr. 22, 2020 for U.S. Appl. No. 16/552,169.

* cited by examiner

METHOD FOR FORMING A FLAT BOTTOM ELECTRODE VIA (BEVA) TOP SURFACE FOR MEMORY

REFERENCE TO RELATED APPLICATIONS

This Application is a Continuation of U.S. application Ser. No. 16/552,169, filed on Aug. 27, 2019, which is a Divisional of U.S. application Ser. No. 15/823,012, filed on Nov. 27, 2017 (now U.S. Pat. No. 10,566,519, issued on Feb. 18, 2020), which claims the benefit of U.S. Provisional Application No. 62/547,230, filed on Aug. 18, 2017. The contents of the above-referenced Patent Applications are hereby incorporated by reference in their entirety.

BACKGROUND

Many modern day electronic devices include non-volatile memory. Non-volatile memory is electronic memory that is able to store data in the absence of power. Some promising candidates for the next generation of non-volatile memory include resistive random-access memory (RRAM) and magnetoresistive random-access memory (MRAM). RRAM and MRAM have relatively simple structures, and are compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
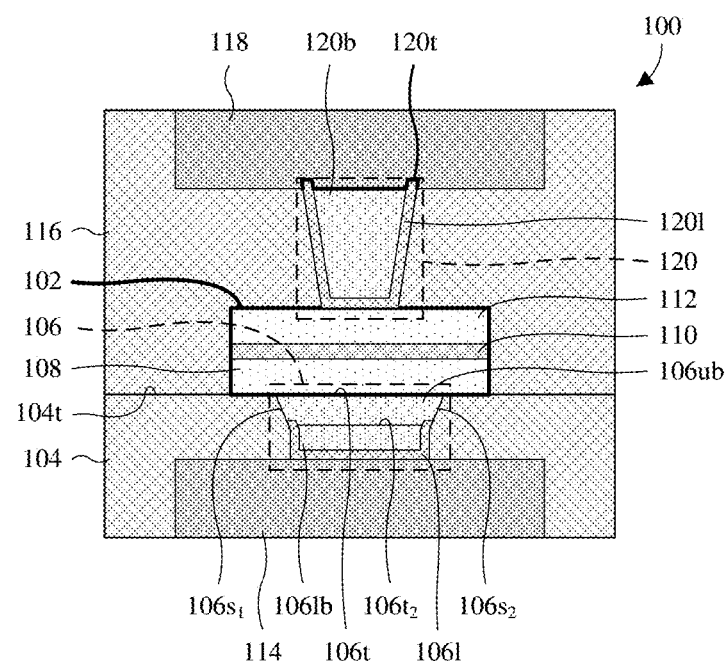
FIG. 1 illustrates a cross-sectional view of some embodiments of an integrated circuit (IC) comprising a memory cell on a flat bottom electrode via (BEVA) top surface.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to a method for forming an integrated circuit (IC), a bottom electrode via (BEVA) dielectric layer is formed covering a metal wire of a back-end-of-line (BEOL) interconnect structure. An etch is performed into the BEVA dielectric layer to form a BEVA opening exposing the metal wire. A metal blocking layer is formed covering the BEVA dielectric layer and conformally lining the BEVA opening, such that the metal blocking layer partially fills the BEVA opening. A metal layer is formed covering the metal blocking layer and filling a remainder of the BEVA opening over the metal blocking layer. A planarization is performed into the metal layer and the metal blocking layer until the BEVA dielectric layer is reached, thereby forming a BEVA in the BEVA opening. The BEVA comprises a BEVA body formed from the metal layer, and further comprises a BEVA liner lining the BEVA body and formed from the metal blocking layer. A memory cell is then formed directly on a top surface of the BEVA.

A challenge with the method is that the metal layer and the metal blocking layer have different hardness values, such that the planarization removes the metal layer and the metal blocking layer at different rates. Accordingly, the top surface of the BEVA is uneven or rough. For example, a top surface of the BEVA body may be vertically offset from a top surface of the BEVA liner. Because the top surface of the BEVA is uneven or rough, the electric field across the memory cell is non-uniform. The non-uniform electric field may, in turn, lead to poor yield and/or non-uniform performance during bulk manufacture of the IC. As feature sizes continue to shrink in ICs, BEVAs and memory cells will also shrink, such that electric field uniformity will be increasingly important in memory cells.

In view of the foregoing, various embodiments of the present application are directed towards a method for forming a flat BEVA top surface for memory, as well as an IC resulting from the method. In some embodiments, an etch is performed into a via dielectric layer to form an opening overlying and exposing a conductive wire underlying the via dielectric layer. A via liner layer is formed covering the via dielectric layer and lining the opening. The via liner layer partially fills the opening. A lower via body layer is formed covering the via dielectric layer and filling a remainder of the opening over the via liner layer. A top surface of the lower via body layer and a top surface of the via liner layer are recessed to below a top surface of the via dielectric layer to partially clear the opening, and to form a via liner and a lower via body in the opening. An upper via body layer is formed covering the via dielectric layer, and filling a portion of the opening cleared by the recessing. The upper via body layer is homogeneous. A planarization is performed into the upper via body layer until the via dielectric layer is reached to form an upper via body in the opening, and overlying the lower via body and the via liner. Collectively, the upper via body, the lower via body, and the via liner define a via in the opening.

Because the upper via body layer is homogeneous, the upper via body layer has a substantially uniform hardness and the planarization removes the upper via body layer at a substantially uniform rate. This, in turn, forms the upper via body with a top surface that is homogeneous, and that is flat or substantially flat. Further, because the top surfaces respectively of the lower via body and the via liner are recessed in the opening, the top surface of the upper via body completely defines a top surface of the via. As such, the top surface of the via is homogeneous, and is flat or substantially flat. Because the top surface of the via is flat or substantially flat, the electric field produced across a memory cell directly on the upper via body may be uniform or substantially uniform.

With reference to FIG. 1, a cross-sectional view 100 of some embodiments of an IC comprising a memory cell 102 is provided. As illustrated, the memory cell 102 is on a lower dielectric layer (e.g., via dielectric layer) 104 and a BEVA (e.g., via) 106. The memory cell 102 reversibly change between a first data state and a second data state depending upon a voltage applied across the memory cell 102. In some embodiments, the memory cell 102 is a resistive random-access memory (RRAM) cell, a magnetoresistive random-access memory (MRAM) cell, or some other suitable type of memory cell. Further, in some embodiments, the memory cell 102 comprises a bottom electrode 108, a data storage element 110, and a top electrode 112.

The bottom electrode 108 overlies the lower dielectric layer 104 and the BEVA 106. In some embodiments, the bottom electrode 108 directly contacts a top surface 106t of the BEVA 106, and/or directly contacts a top surface 104t of the lower dielectric layer 104. The bottom electrode 108 may be or comprise, for example, tantalum nitride, titanium nitride, platinum, iridium, ruthenium, tungsten, silver, copper, some other suitable conductive material(s), or any combination of the foregoing. As used herein, a term (e.g., conductive material) with a suffix of "(s)" may, for example, be singular or plural.

The data storage element 110 overlies the bottom electrode 108, and the top electrode overlies the data storage element 110. The data storage element 110 reversibly changes between a first data state and a second data state depending upon a voltage applied across the memory cell 102. In some embodiments where the memory cell 102 is a RRAM cell, the data storage element 110 is or comprises hafnium oxide, some other suitable high κ dielectric(s), some other suitable dielectric(s), or any combination of the foregoing. As used herein, a high κ dielectric is a dielectric with a dielectric constant κ greater than about 3.9, 5, 10, 15, or 20. In some embodiments where the memory cell 102 is a MRAM cell, the data storage element 110 is or comprises a magnetic tunnel junction (MTJ) or some other suitable magnetic data storage structure. The top electrode 112 may be or comprise, for example, titanium nitride, tantalum nitride, platinum, iridium, tungsten, some other suitable conductive material(s), or any combination of the foregoing.

The lower dielectric layer 104 separates the memory cell 102 from a lower wire (e.g., conductive wire) 114 underlying the memory cell 102 and the BEVA 106. The lower dielectric layer 104 may be or comprise, for example, silicon dioxide, silicon oxynitride, a low κ dielectric, silicon carbide, silicon nitride, some other suitable dielectric(s), or any combination of the foregoing. As used herein, a low κ dielectric is a dielectric with a dielectric constant κ less than about 3.9, 3, 2, or 1. The lower wire 114 may be or comprise, for example, aluminum copper, copper, aluminum, some suitable other suitable conductive material(s), or any combination of the foregoing.

The BEVA 106 extends from a bottom of the memory cell 102, through the lower dielectric layer 104, to the lower wire 114. In some embodiments, the BEVA 106 directly contacts the lower wire 114, and/or the top surface 106t of the BEVA 106 is even or substantially even with the top surface 104t of the lower dielectric layer 104. The top surface 106t of the BEVA 106 is flat or substantially flat, such that an electric field produced across the memory cell 102 using the BEVA 106 is uniform or substantially uniform. Further, the top surface of the BEVA 106 is homogeneous (e.g., a single material). In some embodiments, the top surface 106t of the BEVA 106 extends continuously from a first sidewall $106s_1$ of the BEVA 106 to a second sidewall $106s_2$ of the BEVA 106, where the first and second sidewalls $106s_1$, $106s_2$ are on opposite sides of the BEVA 106 and contact sidewalls of the lower dielectric layer 104.

The BEVA 106 comprises a BEVA liner (e.g., conductive liner) 106l, a lower BEVA body (e.g., lower via body) 106lb, and an upper BEVA body (e.g., upper via body) 106ub. The lower BEVA body 106lb and the upper BEVA body 106ub collectively define a conductive body of the BEVA 106. The upper BEVA body 106ub overlies the lower BEVA body 106lb and the BEVA liner 106l, and defines the top surface 106t of the BEVA 106. Further, the lower BEVA body 106lb and the upper BEVA body 106ub collectively define a BEVA body, such that the lower BEVA body 106lb and the upper BEVA body 106ub may also be referred to as segments of a BEVA body. In some embodiments, the upper BEVA body 106ub directly contacts a top surface $106t_2$ of the lower BEVA body 106lb. The upper BEVA body 106ub and the lower BEVA body 106lb may each be or comprise, for example, aluminum, copper, aluminum copper, tungsten, some other suitable conductive material(s), or any combination of the foregoing.

In some embodiments, the upper BEVA body 106ub is the same material as the lower BEVA body 106lb, and/or is integrated with the lower BEVA body 106lb. In other embodiments, the upper BEVA body 106ub is a different material than the lower BEVA body 106lb. In some embodiments, the upper BEVA body 106ub is completely homogeneous (e.g., a single material) and/or the lower BEVA body 106lb is completely homogeneous (e.g., a single material). In some embodiments, the upper BEVA body 106ub is the same material as the bottom electrode 108, and/or is integrated with the bottom electrode 108. For example, the upper BEVA body 106ub and the bottom electrode 108 may be formed by the same deposition. In other embodiments, the upper BEVA body 106ub is a different material than the bottom electrode 108.

The BEVA liner 106l cups an underside of the lower BEVA body 106lb so as to line a bottom surface of the lower BEVA body 106lb and sidewalls of the lower BEVA body 106lb. The BEVA liner 106l blocks material from the lower BEVA body 106lb from diffusing or otherwise moving out of the lower BEVA body 106lb, and may be or comprise, for example, titanium nitride, titanium, tantalum nitride, tantalum, some other suitable conductive barrier material(s) for the lower BEVA body 106lb, or any combination of the foregoing. In some embodiments, BEVA liner 106l protrudes to a location above the top surface $106t_2$ of the lower BEVA body 106lb. Further, in some embodiments, the BEVA liner 106l partially lines sidewalls of the upper BEVA body 106ub.

An upper dielectric layer 116 covers the lower dielectric layer 104 and the memory cell 102, and further accommodates an upper wire 118 and a TEVA 120. The upper dielectric layer 116 may be or comprise, for example, silicon dioxide, a low κ dielectric, silicon carbide, silicon nitride, some suitable other dielectric(s), or any combination of the foregoing. The upper wire 118 may be or comprise, for example, aluminum copper, copper, aluminum, some other suitable conductive material(s), or any combination of the foregoing.

The TEVA 120 is directly between the upper wire 118 and the memory cell 102, and extends from the upper wire 118, through the upper dielectric layer 116, to the memory cell 102. In some embodiments, the TEVA 120 is homogenous (e.g., a single material). In other embodiments, the TEVA 120 is heterogeneous and comprises a TEVA body 120b and a TEVA liner 120l. The TEVA body 120b may be or comprise, for example, copper, aluminum copper, aluminum, tungsten, some other suitable conductive material(s), or any combination of the foregoing. The TEVA liner 120l blocks material of the TEVA body 120b from diffusing or otherwise moving out of the TEVA 120, and may be or comprise, for example, titanium nitride, tantalum, tantalum nitride, some other suitable conductive barrier material(s) for the TEVA body 120b, or any combination of the foregoing. In some embodiments in which the TEVA 120 is heterogeneous, a top surface 120t of the TEVA 120 is heterogeneous, and is rough or uneven.

Figure 2:
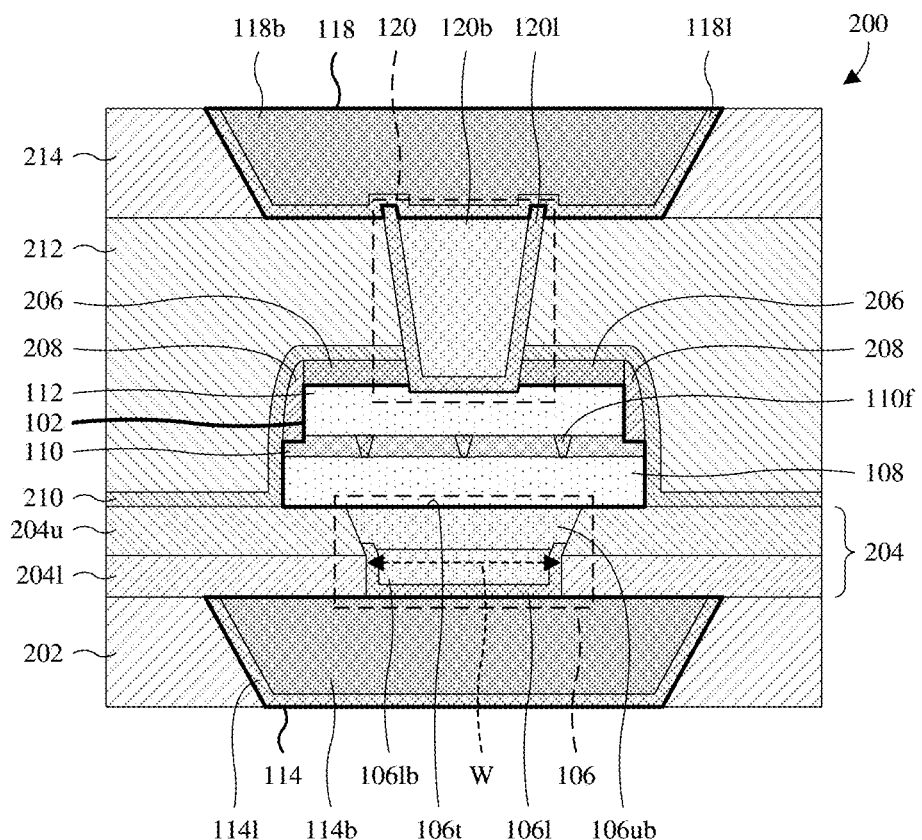
FIG. 2 illustrates a cross-sectional view of some more detailed embodiments of the IC of FIG. 1.

With reference to FIG. 2, a cross-sectional view 200 of some more detailed embodiments of the IC of FIG. 1 is provided. As illustrated, the lower wire 114 is within a lower interlayer dielectric (ILD) layer 202. The lower ILD layer 202 may be or comprise, for example, silicon dioxide, silicon oxynitride, a low κ dielectric, silicon nitride, some other suitable dielectric(s), or any combination of the foregoing. In some embodiments, the lower wire 114 comprises a lower wire body 114b and a lower wire liner 114l. The lower wire body 114b may be or comprise, for example, aluminum copper, copper, aluminum, some other suitable metal, some other suitable conductive material(s), or any combination of the foregoing. The lower wire liner 114l cups an underside of the lower wire body 114b so as to line a bottom surface of the lower wire body 114b and sidewalls of the lower wire body 114b. Further, the lower wire liner 114l blocks material from the lower wire body 114b from diffusing or otherwise moving out of the lower wire body 114b. The lower wire liner 114l may be or comprise, for example, tantalum, titanium, titanium nitride, tantalum nitride, some other suitable conductive barrier material(s) for the lower wire body 114b, or any combination of the foregoing.

A BEVA dielectric layer 204 overlies the lower wire 114 and the lower ILD layer 202, and accommodates the BEVA 106. In some embodiments, the BEVA dielectric layer 204 comprise a lower BEVA dielectric layer 204l and an upper BEVA dielectric layer 204u overlying the lower BEVA dielectric layer 204l. Further, in some embodiments, the upper and lower BEVA dielectric layers 204u, 204l are different materials. The upper and lower BEVA dielectric layers 204u, 204l may each be or comprise, for example, silicon carbide, silicon nitride, some other suitable dielectric(s), or any combination of the foregoing. In some embodiments, the upper BEVA dielectric layer 204u is or comprises silicon nitride, some other suitable nitride, or some other suitable dielectric, and/or the lower BEVA dielectric layer 204l is silicon carbide or some other suitable dielectric.

The BEVA 106 extends through the BEVA dielectric layer 204 from the lower wire 114 to the memory cell 102. In some embodiments, a width W of the BEVA 106 is uniform or substantially uniform from the lower wire 114 to an interface between the upper and lower BEVA dielectric layers 204u, 204l. Further, in some embodiments, the width W of the BEVA 106 increases continuously from the interface to the top surface 106t of the BEVA 106. The BEVA 106 comprises the BEVA liner 106l, the lower BEVA body 106lb, and the upper BEVA body 106ub. The upper BEVA body 106ub overlies the lower BEVA body 106lb and defines the top surface 106t of the BEVA 106. The BEVA liner 106l cups an underside of the lower BEVA body. The top surface 106t of the BEVA 106 supports the memory cell 102 and is flat or substantially flat to promote a uniform or substantially uniform electric field across the memory cell 102. Further, the top surface 106t of the BEVA 106 is also homogeneous.

The memory cell 102 reversibly changes between a first data state and a second data state depending upon a voltage applied across the memory cell 102, and may be, for example, a RRAM cell, a MRAM cell, or some other suitable type of memory cell. In some embodiments where the memory cell 102 is an RRAM cell, the data storage element 110 of the memory cell 102 is normally insulating. However, the data storage element 110 can be made to conduct through conductive filaments 110f formed in the data storage element 110 by application of an appropriate voltage across the memory cell 102. For ease of illustration, only one of the conductive filaments 110f is labeled 110f. Once the conductive filaments 110f are formed, the conductive filaments 110f may be reset (e.g., broken, resulting in a high resistance) or set (e.g., re-formed, resulting in a lower resistance) by application of an appropriate voltage across the memory cell 102. The low and high resistances may be used to indicate a digital signal (i.e., "1" or "0"), thereby allowing for data storage.

A hard mask 206 overlies the memory cell 102, and a spacer 208 overlies the data storage element 110 of the memory cell 102. The spacer 208 comprises a pair of segments respectively bordering opposite sidewalls of the top electrode 112 of the memory cell 102. In some embodiments, the segments respectively border opposite sidewalls of the hard mask 206 that are respectively aligned with the opposite sidewalls of the top electrode 112. In some embodiments, the spacer 208 extends laterally along sidewalls of the top electrode 112 in a closed path to completely enclose the top electrode 112. Note that this is not visible within the cross-sectional view 200 of FIG. 2. In some embodiments, the spacer 208 is sunken into a top surface of the data storage element 110 (e.g., due to over etching). The hard mask 206 and the spacer 208 may each be or comprise, for example, silicon nitride, silicon oxide, silicon oxynitride, some other suitable dielectric(s), or any combination of the foregoing.

A capping layer 210 lines sidewalls of the memory cell 102 and sidewalls of the spacer 208, and further overlies the hard mask 206 and the BEVA dielectric layer 204. Further, a device ILD layer 212 overlies the capping layer 210 and the BEVA dielectric layer 204. The capping layer 210 may be or comprise, for example, silicon oxide, some other suitable oxide(s), some other dielectric(s), or any combination of the foregoing. The device ILD layer 212 may be or comprise, for example, silicon dioxide, a low κ dielectric, silicon nitride, some other suitable dielectric(s), or any combination of the foregoing.

The upper wire 118 overlies the memory cell 102 and the device ILD layer 212, within an upper ILD layer 214. The upper ILD layer 214 may be or comprise, for example, silicon dioxide, a low κ dielectric, silicon nitride, some other suitable dielectric(s), or any combination of the foregoing. In some embodiments, the upper wire 118 comprises an upper wire body 118b and an upper wire liner 118l. The upper wire body 118b may be or comprise, for example, aluminum copper, copper, aluminum, some other suitable metal(s), some other suitable conductive material(s), or any combination of the foregoing. The upper wire liner 118l cups an underside of the upper wire body 118b so as to line a bottom surface of the upper wire body 118b and sidewalls of the upper wire body 118b. Further, the upper wire liner 118l blocks material from the upper wire body 118b from diffusing or otherwise moving out of the upper wire body 118b, and may be or comprise, for example, tantalum, titanium, titanium nitride, tantalum nitride, some other suitable barrier material(s) for the upper wire body 118b, or any combination of the foregoing.

The TEVA 120 is in the device ILD layer 212 and extends from the upper wire 118, through the device ILD layer 212, to the memory cell 102. In some embodiments, the TEVA 120 extends through the capping layer 210 and the hard mask 206, and/or is sunken into a top of the top electrode 112 of the memory cell 102. The TEVA 120 comprises a TEVA body 120b and a TEVA liner 120l. The TEVA liner 120l cups an underside of the TEVA body 120b and blocks material of the TEVA body 120b from migrating out of the TEVA 120.

Figure 3:
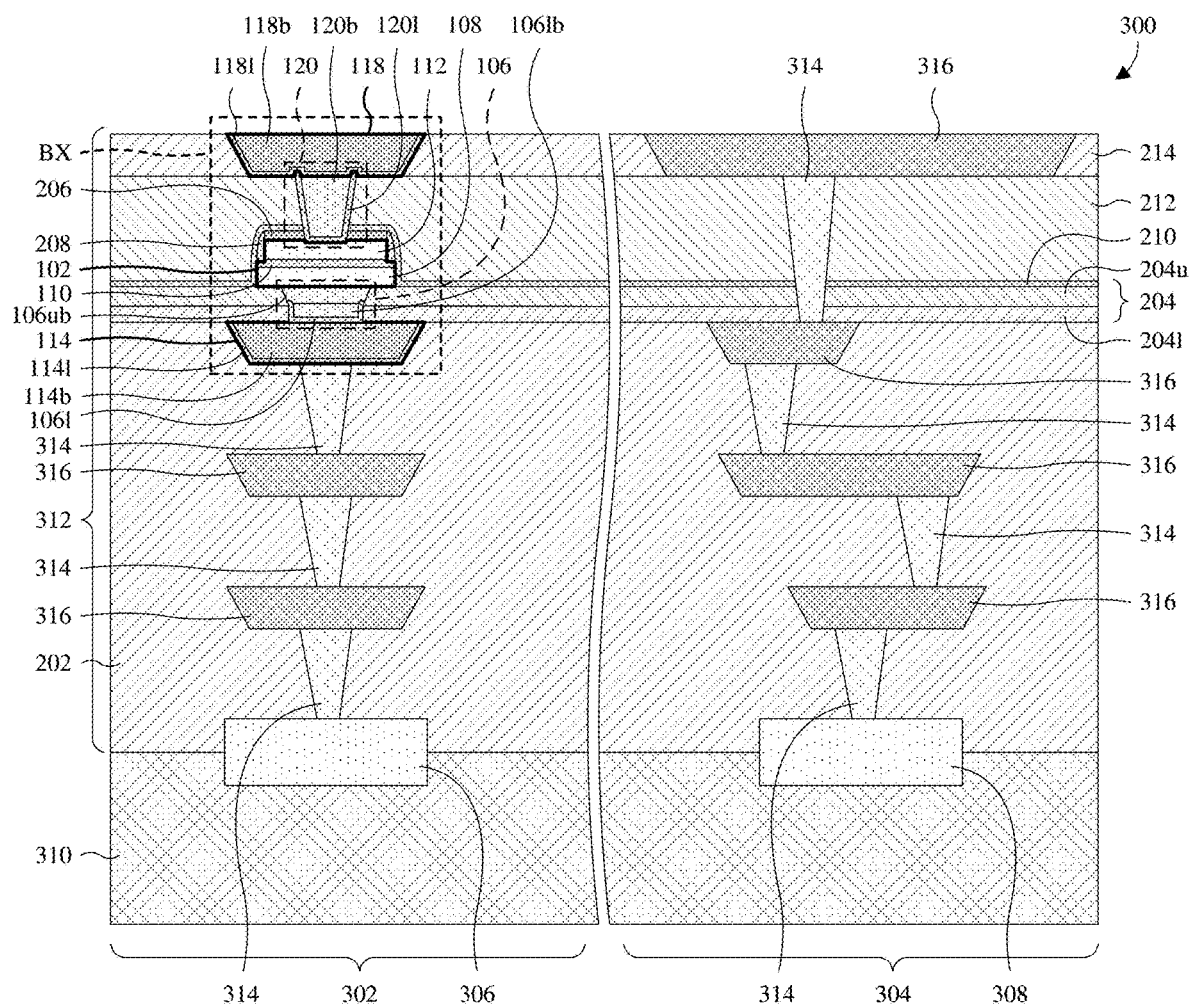
FIG. 3 illustrates a cross-sectional view of some more detailed embodiments of the IC of FIG. 2.

With reference to FIG. 3, an expanded cross-sectional view 300 of some embodiments of the IC of FIG. 2 is provided. The cross-sectional view 200 of FIG. 2 may, for example, be taken within box BX. As illustrated, the IC includes a memory region 302 and a logic region 304. The memory region 302 accommodates the memory cell 102. The memory cell 102 rests on the BEVA 106 and underlies the TEVA 120. The BEVA 106 has a top surface that is homogeneous. Further, the top surface of the BEVA 106 is flat or substantially flat, so as to produce a uniform electric field across the memory cell 102.

In some embodiments, the memory cell 102 is one of many memory cells defining a memory cell array (not labeled) in the memory region 302. In some embodiments, each memory cell of the memory cell array is as the memory cell 102 is shown and described with respect to FIG. 1 and/or FIG. 2. In some embodiments, each memory cell of the memory cell array rests on a BEVA and underlies a TEVA. Each TEVA of the memory cell array may, for example, be as the TEVA 120 is shown and described with respect to FIG. 1 and/or FIG. 2. Each BEVA of the memory cell array may, for example, be as the BEVA 106 is shown and described with respect to FIG. 1 and/or FIG. 2 so as to produce a uniform or substantially uniform electric field across a corresponding memory cell. In some embodiments, each memory cell of the memory cell array overlies and is electrically coupled to an access device 306. The access device 306 facilitates access or selection of a corresponding memory cell in the memory cell array and may be, for example, an insulated gate field-effect transistor (IGFET), a metal-oxide-semiconductor field-effect transistor (MOSFET), or some other suitable type of semiconductor device.

The logic region 304 accommodates a logic device 308. The logic device 308 may be or comprise, for example, an IGFET, a MOFSET, or some other suitable type of semiconductor device. In some embodiments, the logic device 308 is one of many logic devices defining a logic core (not labeled). In some of such embodiments, operation of the logic core is supported or aided by the memory cell array, and/or the memory cell array is embedded memory. Further, in some embodiments, the logic device 308 supports operation of the memory cell 102 and/or the memory cell array. For example, the logic device 308 may facilitate reading and/or writing data of to the memory cell 102 and/or the memory cell array.

In addition to the memory cell 102 and the logic device 308, the IC further comprises a semiconductor substrate 310 and a BEOL interconnect structure 312. The semiconductor substrate 310 supports and partially defines the logic device 308 and, in some embodiments, the access device 306. In some embodiments, the semiconductor substrate 310 further supports and partially defines a logic core that includes the logic device 308. The semiconductor substrate 310 may be, for example, a bulk silicon substrate, a silicon-on-insulator (SOI) substrate, or some other suitable type of semiconductor substrate. The BEOL interconnect structure 312 overlies the semiconductor substrate 310 and accommodates the memory cell 102. In some embodiments, the BEOL interconnect structure 312 further overlies and accommodates a memory cell array that includes the memory cell 102. The BEOL interconnect structure 312 comprises a dielectric stack and a plurality of conductive features.

The dielectric stack comprises a lower ILD layer 202 covering the semiconductor substrate 310 and the logic device 308. In some embodiments, the lower ILD layer 202 further covers the access device 306. The dielectric stack further comprises a BEVA dielectric layer 204 covering the lower ILD layer 202, a device ILD layer 212 covering the BEVA dielectric layer 204, and an upper ILD layer 214 covering the device ILD layer 212.

The conductive features are stacked in the dielectric stack to define conductive paths interconnecting the memory cell 102, the logic device 308, and other devices of the IC (e.g., the access device 306). The conductive features include the lower wire 114, the upper wire 118, the BEVA 106, and the TEVA 120. Further, the conductive features include a plurality of additional vias 314 and a plurality of additional wires 316. The additional vias 314 and the additional wires 316 may be or comprise, for example, tungsten, copper, aluminum copper, aluminum, some other suitable conductive material(s), or any combination of the foregoing.

While the foregoing discussion of FIGS. 1-3 dealt with memory on the BEVA 106, it is to be appreciated that other types of electronic devices may be on the BEVA 106. For example, a metal-insulator-metal (MIM) capacitor, some other suitable type of MIM structure, or some other suitable type of electronic device may be on the BEVA 106.

With reference to FIGS. 4-6, 7A-7C, 8-20, a series of cross-sectional views 400-600, 700A-700C, 800-2000 of some embodiments of a method for forming an IC comprising a memory cell on a flat BEVA top surface is provided. The IC may be, for example, the IC of FIG. 2.

Figure 4:
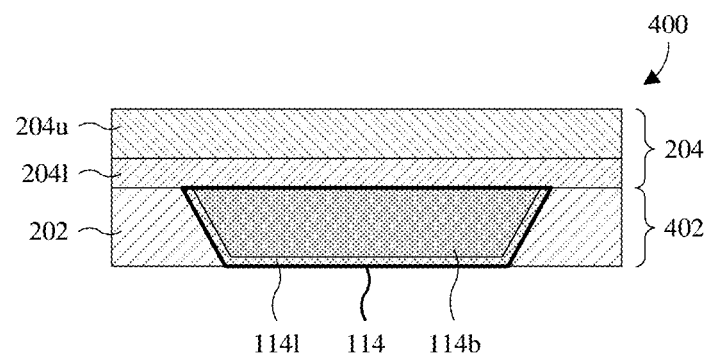
FIGS. 4-6, 7A-7C, 8-20 illustrate a series of cross-sectional views of some embodiments of a method for forming an IC comprising a memory cell on a flat BEVA top surface.

As illustrated by the cross-sectional view 400 of FIG. 4, a substrate 402 is provided or formed. The substrate 402 comprises a lower ILD layer 202 and a lower wire 114. Further, in some embodiments, the substrate 402 comprises the semiconductor substrate 310 of FIG. 3, a portion of the interconnect structure 312 of FIG. 3 that is below the BEVA dielectric layer 204, the access device 306 of FIG. 3, the logic device 308 of FIG. 3, or any combination of the foregoing. The lower ILD layer 202 may be or comprise, for example, silicon nitride, silicon oxide, a low κ dielectric layer, some other suitable dielectric(s), or any combination of the foregoing. The lower wire 114 is recessed into a top of the lower ILD layer 202, such that a top surface of the lower wire 114 is even or substantially even with a top surface of the lower ILD layer 202. The lower wire 114 may be or comprise, for example, titanium nitride, tantalum, tantalum nitride, titanium, aluminum, aluminum copper, copper, some other suitable conductive material(s), or any combination of the foregoing. In some embodiments, the lower wire 114 is heterogeneous (e.g., multiple materials) and comprises a lower wire body 114b and a lower wire liner 114l. The lower wire liner 114l cups an underside of the lower wire body 114b and blocks material of the lower wire body 114b from migrating to surrounding structure. The lower wire liner 114l may be or comprise, for example, titanium, tantalum, titanium nitride, tantalum nitride, some other suitable barrier material(s) for the lower wire body 114b, or any combination of the foregoing. The lower wire body 114b may be or comprise, for example, copper, aluminum copper, aluminum, some other suitable conductive material(s), or any combination of the foregoing.

Also illustrated by the cross-sectional view 400 of FIG. 4, a BEVA dielectric layer 204 is formed covering the substrate 402. The BEVA dielectric layer 204 may be or comprise, for example, silicon carbide, silicon nitride, silicon oxide, silicon oxynitride, some other suitable dielectric(s), or any combination of the foregoing. In some embodiments, the BEVA dielectric layer 204 comprises a lower BEVA dielectric layer 204l and an upper BEVA dielectric layer 204u covering the lower BEVA dielectric layer 204l. The lower BEVA dielectric layer 204l may be or comprise, for example, silicon carbide or some other suitable dielectric, and/or the upper BEVA dielectric layer 204u may be or comprise, for example, silicon nitride or some other suitable dielectric. In some embodiments, a process for forming the BEVA dielectric layer 204 comprises chemical vapor deposition (CVD), physical vapor deposition (PVD), some other suitable deposition process(es), or any combination of the foregoing. As used herein, a term (e.g., process) with a suffix of "(es)" may, for example, be singular or plural.

Figure 5:
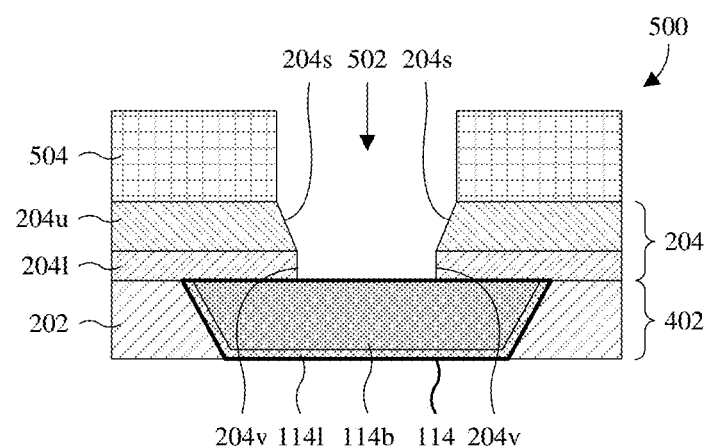

As illustrated by the cross-sectional view 500 of FIG. 5, a first etch is performed into the BEVA dielectric layer 204 to form a BEVA opening 502 overlying and exposing the lower wire 114. In some embodiments, upon completion of the first etch, the upper BEVA dielectric layer 204u has a pair of slanted sidewalls 204s in the BEVA opening 502 and respectively on opposite sides of the BEVA opening 502, whereas the lower BEVA dielectric layer 204l has a pair of vertical or substantially vertical sidewalls 204v in the BEVA opening 502 and respectively on the opposite sides.

In some embodiments, a process for performing the first etch comprises forming a photoresist mask 504 on the BEVA dielectric layer 204. The photoresist mask 504 may, for example, be formed by depositing a photoresist layer on the BEVA dielectric layer 204 and patterning the photoresist layer with a layout of the BEVA opening 502. The depositing may, for example, be performed by spin coating or some other suitable deposition process, and/or the patterning may, for example, be performed by photolithography or some other suitable patterning process. One or more first etchants are applied to the upper BEVA dielectric layer 204u until the lower BEVA dielectric layer 204l is reached by the first etchant(s) to partially form the BEVA opening 502. One or more second etchants are applied to the lower BEVA dielectric layer 204l, through the BEVA opening 502 as partially formed, until the lower wire 114 is reached by the second etchant(s) to finish forming the BEVA opening 502. The photoresist mask 504 is thereafter removed.

Figure 6:
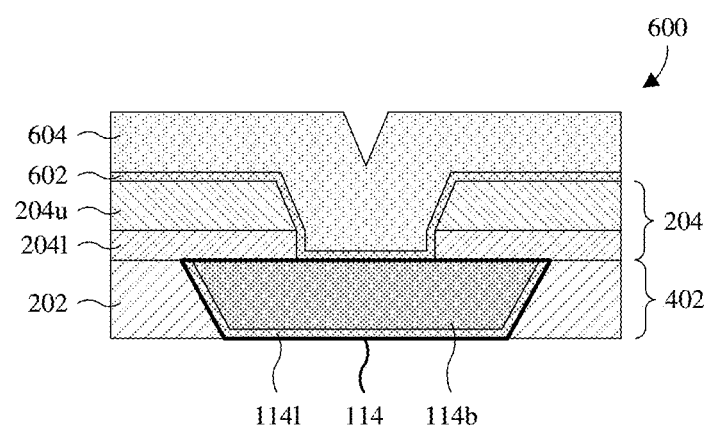

As illustrated by the cross-sectional view 600 of FIG. 6, a BEVA liner layer 602 is formed covering the BEVA dielectric layer 204, and is further formed lining the BEVA opening 502 (see FIG. 5) so as to partially fill the BEVA opening 502. In some embodiments, the BEVA liner layer 602 conformally lines the BEVA opening 502. The BEVA liner layer 602 is conductive and, in some embodiments, is homogenous (e.g., a single material). The BEVA liner layer 602 may, for example, be or comprise titanium, titanium nitride, tantalum, tantalum nitride, some other suitable conductive material(s), or any combination of the foregoing. Further, the BEVA liner layer 602 may, for example, be formed by CVD, PVD, some other suitable deposition process(es), or any combination of the foregoing.

Also illustrated by the cross-sectional view 600 of FIG. 6, a lower BEVA body layer (e.g., lower via body layer) 604 is formed covering the BEVA dielectric layer 204, and further filling a remainder of the BEVA opening 502 (see FIG. 5), over the BEVA liner layer 602. The lower BEVA body layer 604 is conductive and, in some embodiments, is homogeneous (e.g., a single material). Further, the lower BEVA body layer 604 is a different material than the BEVA liner layer 602 and, in some embodiments, has a different hardness value than the BEVA liner layer 602. The lower BEVA body layer 604 may be or comprise, for example, copper, aluminum copper, aluminum, tungsten, some suitable other metal(s), some other suitable conductive material(s), or any combination of the foregoing. In some embodiments, the BEVA liner layer 602 is or otherwise comprises a barrier material for the lower BEVA body layer 604 so as to prevent material of the lower BEVA body layer 604 from migrating through the BEVA liner layer 602 to surrounding structure. The lower BEVA body layer 604 may be formed by, for example, CVD, PVD, sputtering, electroless plating, electroplating, some other suitable plating or deposition process(es), or any combination of the foregoing.

Figure 7A:
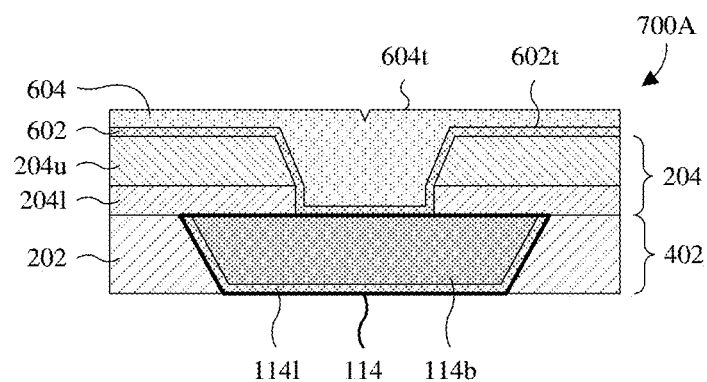

As illustrated by the cross-sectional view 700A of FIG. 7A, a first planarization is performed into a top surface 604t of the lower BEVA body layer 604 to flatten or substantially flatten the top surface 604t, and to recess the top surface 604t. Further, the first planarization stops before reaching the BEVA liner layer 602, so the BEVA liner layer 602 remains fully covered by the lower BEVA body layer 604 upon completion of the first planarization. The first planarization may, for example, be performed by a chemical mechanical polish (CMP) or some other suitable planarization process.

Figure 7B:
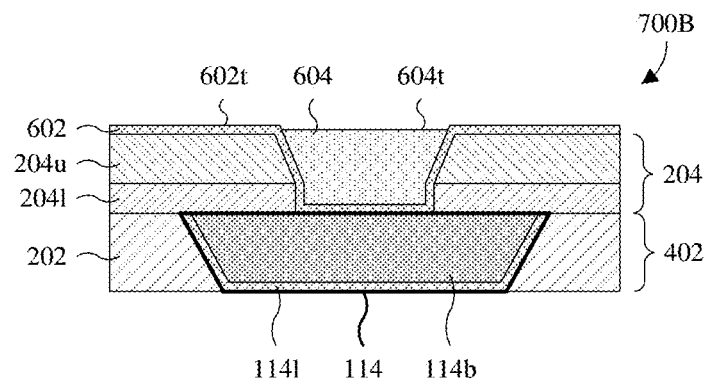

Alternatively, as illustrated by the cross-sectional view 700B of FIG. 7B, the first planarization stops on the BEVA liner layer 602, so the BEVA liner layer 602 is exposed upon completion of the first planarization. Further, in some embodiments, the top surface 604t of the lower BEVA body layer 604 is vertically offset from a top surface 602t of the BEVA liner layer 602. The vertical offset may, for example, be due to different hardnesses between the lower BEVA body layer 604 and the BEVA liner layer 602. Namely, the different hardnesses may, for example, cause the lower BEVA body layer 604 and the BEVA liner layer 602 to be removed at different rates during the first planarization, thereby causing the vertical offset.

Figure 7C:
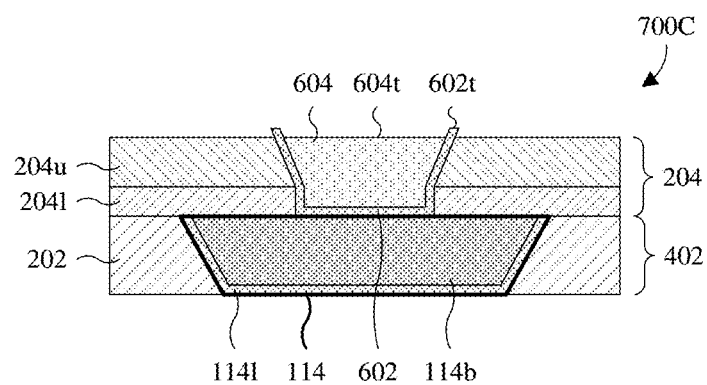

Alternatively, as illustrated by the cross-sectional view 700C of FIG. 7C, the first planarization stops on the BEVA dielectric layer 204, so the BEVA dielectric layer 204 is exposed upon completion of the first planarization. Further, the first planarization additionally recesses the top surface 602t of the BEVA liner layer 602. As in FIG. 7B, in some embodiments, the top surface 604t of the lower BEVA body layer 604 is vertically offset from the top surface 602t of the BEVA liner layer 602 due to, for example, different hardnesses between the lower BEVA body layer 604 and the BEVA liner layer 602.

As should be appreciated, FIGS. 7A-7C are alternative embodiments of the same process step(s) (e.g., the first planarization). Therefore, in some embodiments, the method proceeds from FIG. 6 to FIG. 8 via any one of the FIGS. 7A-7C. For example, the method may proceed from FIG. 6 to FIG. 8 via FIG. 7A. As another example, the method may proceed from FIG. 6 to FIG. 8 via FIG. 7B. As yet another example, the method may proceed from FIG. 6 to FIG. 8 via FIG. 7C. In some embodiments, the difference between FIGS. 7A-7C is the amount of the semiconductor structure of FIG. 6 that is removed by the first planarization. For example, a first amount of the semiconductor structure of FIG. 6 may be removed at FIG. 7A, a second amount of the semiconductor structure of FIG. 6 may be removed at FIG. 7B, and a third amount of the semiconductor structure of FIG. 6 may be removed at FIG. 7C, where the third amount is greater than the second amount, which is greater than the first amount. In alternative embodiments, the method proceeds from the process step(s) of FIG. 6 to the process step(s) of FIG. 8 without the process step(s) of FIGS. 7A-7C. In other words, the first planarization of FIGS. 7A-7C may be omitted in alternative embodiments.

Figure 8:
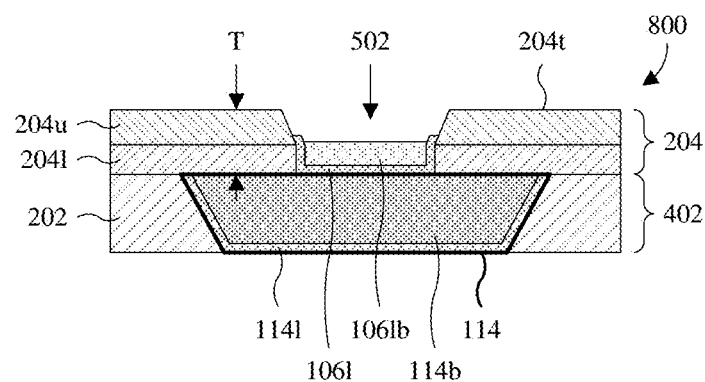

As illustrated by the cross-sectional view 800 of FIG. 8, a second etch is performed into the lower BEVA body layer 604 (see FIG. 6, 7A, 7B, or 7C) and the BEVA liner layer 602 (see FIG. 6, 7A, 7B, or 7C) to etch back the lower BEVA body layer 604 and the BEVA liner layer 602. The second etch recesses the top surface 604t of the lower BEVA body layer 604 (see FIG. 6, 7A, 7B, or 7C) and the top surface 602t of the BEVA liner layer 602 (see FIG. 6, 7A, 7B, or 7C) to locations spaced below a top surface 204t of the BEVA dielectric layer 204, thereby partially clearing the BEVA opening 502 and forming a BEVA liner 106l and a lower BEVA body 106lb. In some embodiments, the top surface 602t of the BEVA liner layer 602 is above the top surface 604t of the lower BEVA body layer 604. In some embodiments, the top surface 602t of the BEVA liner layer 602 is even with the top surface 604t of the lower BEVA body layer 604. In some embodiments, the top surface 602t of the BEVA liner layer 602 is below the top surface 604t of the lower BEVA body layer 604. The BEVA liner 106l is formed from the BEVA liner layer 602, and the lower BEVA body 106lb is formed from the lower BEVA body layer 604. In some embodiments, the second etch also recesses the top surface 204t of the BEVA dielectric layer 204 (albeit, at a slower rate than the lower BEVA body layer 604 and the BEVA liner layer 602) to decreases a thickness T of the BEVA dielectric layer 204.

The second etch is performed by an etchant that preferentially etches the lower BEVA body layer 604 and the BEVA liner layer 602, relative to the BEVA dielectric layer 204, so the BEVA dielectric layer 204 is minimally etched. For example, the etchant may have a first etch rate for the lower BEVA body layer 604, a second etch rate for the BEVA liner layer 602, and a third etch rate for the BEVA dielectric layer 204, where the first and second etch rates are greater than the third etch rate. In some embodiments, the first and second etch rates are the same. In some embodiments, the first etch rate is greater than the second etch rate. In some embodiments, the first etch rate is less than the second etch rate. In some embodiments, the first etch rate(s) are between about 3-15 time greater than the second etch rate(s), between about 1-20 times greater than the second etch rate(s), between about 1-5 times greater than the second etch rate(s), between about 13-27 time greater than the second etch rate(s), or some other suitable relationship between the first and second etch rates. The second etch may, for example, be a wet etch or a dry etch. In some embodiments, the etchant of the second etch comprises hydrogen peroxide, some other suitable chemical solution(s), or any combination of the foregoing. In other embodiments, the etchant of the second etch comprises ions or some other suitable dry etchant(s).

In some embodiments, the second etch proceeds from any one of the FIGS. 7A-7C. For example, the second etch may proceed from FIG. 7A. As another example, the second etch may proceed from FIG. 7B. As yet another example, the second etch may proceed from FIG. 7C. In some embodiments, depending upon which one of FIGS. 7A-7C that FIG. 8 proceeds from, the etch time for the second etch is varied. Further, in some embodiments, the etch time for the second etch is inversely proportional to the amount of the semiconductor structure of FIG. 6 that is removed by the first planarization of FIGS. 7A-7C. For example, the second etch has a first etch time when proceeding from FIG. 7A, a second etch time when proceeding from FIG. 7B, and a third etch time when proceeding from FIG. 7C, where the third etch time is less than the second etch time, which is less than the first etch time.

Figure 9:
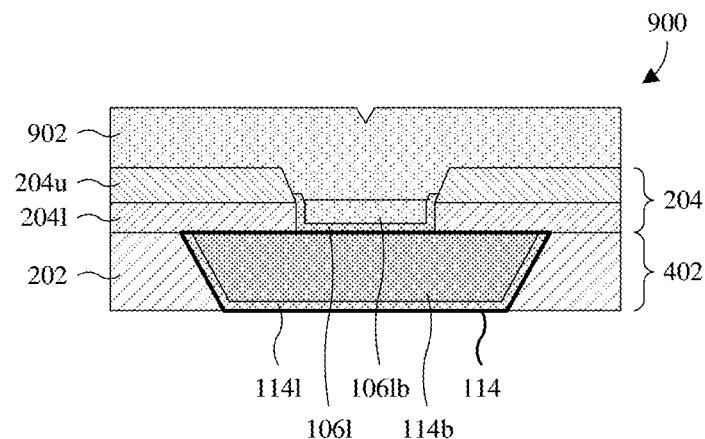

As illustrated by the cross-sectional view 900 of FIG. 9, an upper BEVA body layer (e.g., upper via body layer) 902 is formed covering the BEVA dielectric layer 204, and further filling a portion of the BEVA opening 502 (see FIG. 8) cleared by the second etch. The upper BEVA body layer 902 is conductive and is homogeneous (e.g., a single material). In some embodiments, the upper BEVA body layer 902 is the same material as the lower BEVA body 106lb. In other embodiments, the upper BEVA body layer 902 is a different material than the lower BEVA body 106lb. For example, the upper BEVA body layer 902 may be the same material as the BEVA liner 106l or some other suitable barrier material for lower BEVA body 106lb. The upper BEVA body layer 902 may be, for example, copper, aluminum copper, aluminum, tungsten, some suitable other metal(s), or some other suitable conductive material(s). The upper BEVA body layer 902 may be formed by, for example, CVD, PVD, sputtering, electroless plating, electroplating, some other suitable plating or deposition process(es), or any combination of the foregoing.

Figure 10:
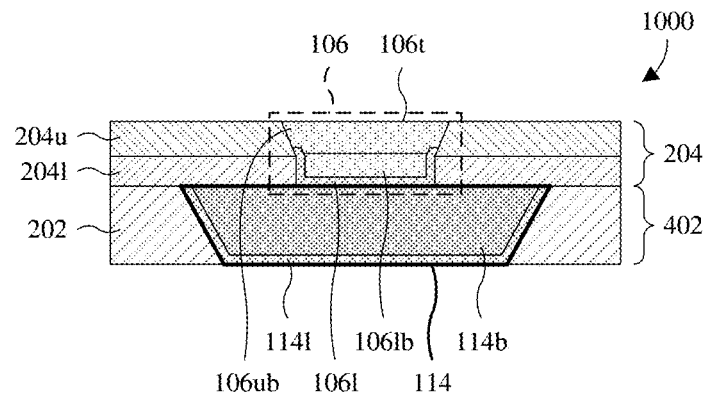

As illustrated by the cross-sectional view 1000 of FIG. 10, a second planarization is performed into the upper BEVA body layer 902 (see FIG. 9) until the BEVA dielectric layer 204 is reached to form an upper BEVA body 106ub from the upper BEVA body layer 902. The second planarization may, for example, be performed by a chemical mechanical polish (CMP) or some other suitable planarization process. The upper BEVA body 106ub is in the BEVA opening 502 (see FIG. 8), and overlies the lower BEVA body 106lb and the BEVA liner 106l. Further, the upper BEVA body 106ub, the lower BEVA body 106lb, and the BEVA liner 106l collectively define a BEVA 106 in the BEVA opening 502, and the upper BEVA body 106ub individually defines a top surface 106t of the BEVA 106.

The top surface 106t of the BEVA 106 is homogenous because the top surface 106t is formed from the upper BEVA body layer 902, and because the upper BEVA body layer 902 is homogeneous. Similarly, the top surface 106t of the BEVA 106 is flat or substantially flat because the top surface 106t is formed from the upper BEVA body layer 902, and because the upper BEVA body layer 902 is homogeneous. In particular, because the upper BEVA body layer 902 is homogenous, it has a substantially uniform hardness throughout and hence a substantially uniform removal rate during the second planarization. Therefore, the second planarization uniformly or substantially uniformly removes material of the upper BEVA body layer 902 to form the top surface 106*t* of the BEVA 106 flat or substantially flat. Because the top surface 106*t* of the BEVA 106 is flat or substantially flat, the electric field across a memory cell subsequently formed on the BEVA 106 is uniform or substantially uniform.

Figure 11:
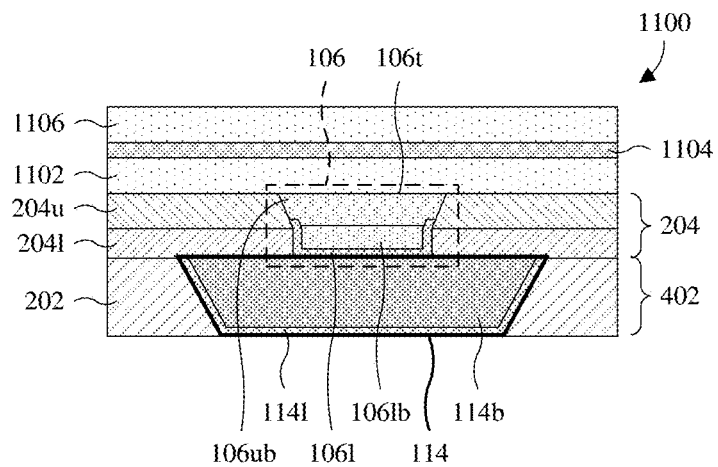

As illustrated by the cross-sectional view 1100 of FIG. 11, a bottom electrode layer 1102, a data storage layer 1104, and a top electrode layer 1106 are formed on the BEVA 106 and the BEVA dielectric layer 204. The bottom electrode layer 1102 is formed covering the BEVA dielectric layer 204 and the BEVA 106. The data storage layer 1104 is formed covering the bottom electrode layer 1102. The top electrode layer 1106 is formed covering the data storage layer 1104. The bottom and top electrode layers 1102, 1106 are conductive, and may be or comprise, for example, metals, metal nitrides, or some suitable other conductive material(s). The data storage layer 1104 reversibly changes between a first data state (e.g., a first resistance) and a second data state (e.g., a second resistance) depending upon a voltage applied across the data storage layer 1104. In some embodiments where the memory cell under manufacture is an RRAM cell, the data storage layer 1104 may be or comprise, for example, hafnium oxide, some other suitable high κ dielectric(s), or some other suitable dielectric(s). In some embodiments where the memory cell under manufacture is an MRAM cell, the data storage layer 1104 may be or comprise, for example, a MTJ layer or some other suitable magnetic storage structure. The MTJ layer may, for example, comprise a first ferromagnetic layer, an insulating layer overlying the first ferromagnetic layer, and a second ferromagnetic layer overlying the insulating layer. In some embodiments, the bottom and top electrode layers 1102, 1106 and the data storage layer 1104 are formed by CVD, PVD, electroless plating, electroplating, sputtering, some suitable other plating or deposition process(es), or any combination of the foregoing.

Figure 12:
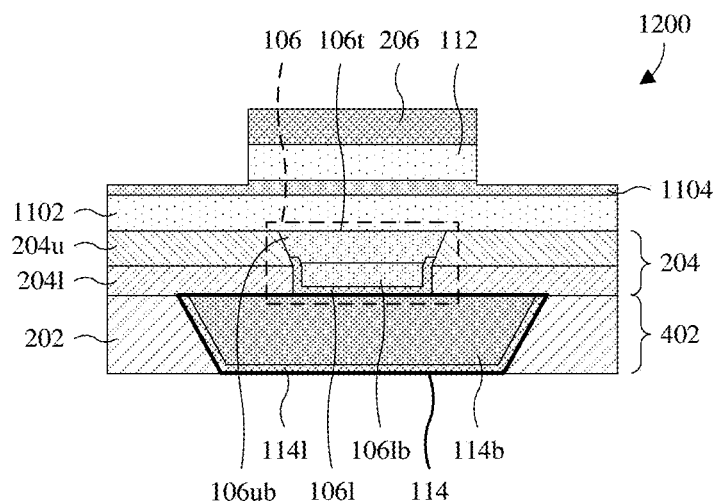

As illustrated by the cross-sectional view 1200 of FIG. 12, a hard mask 206 is formed covering a memory cell region of the top electrode layer 1106 (see FIG. 11) that overlies the BEVA 106. The hard mask 206 may be or comprise, for example, silicon nitride, some other suitable nitride(s), some other suitable dielectric(s), or any combination of the foregoing. Further, the hard mask 206 may, for example, be formed by depositing a hard mask layer on the top electrode layer 1106 and patterning the hard mask layer into the hard mask 206. The depositing may, for example, be performed by CVD, PVD, or some other suitable deposition process, and/or the patterning may, for example, be performed by using a photolithography/etching process or some other suitable patterning process.

Also illustrated by the cross-sectional view 1200 of FIG. 12, a third etch is performed into the top electrode layer 1106 (see FIG. 11) with the hard mask 206 in place to form a top electrode 112 underlying the hard mask 206. In some embodiments, the data storage layer 1104 serves as an etch stop for the third etch and/or the third etch over extends into the data storage layer 1104 to partially etch the data storage layer 1104.

Figure 13:
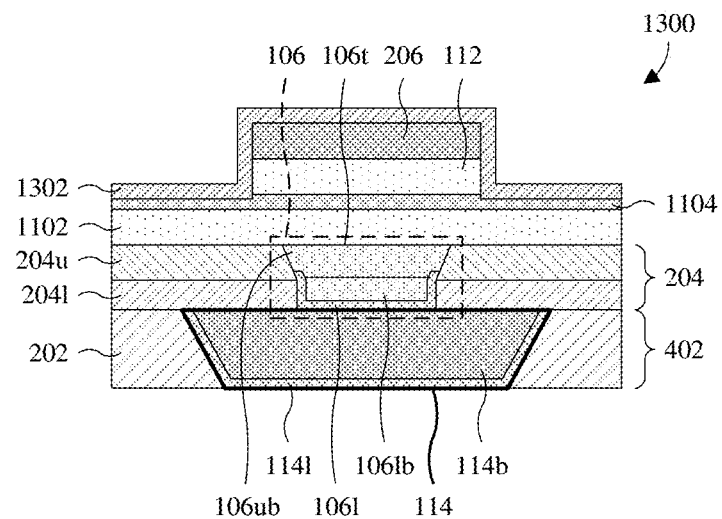

As illustrated by the cross-sectional view 1300 of FIG. 13, a spacer layer 1302 is formed covering and lining the structure of FIG. 12. In some embodiments, the spacer layer 1302 is formed conformally, and/or is formed by CVD, PVD, some other suitable deposition process(es), or any combination of the foregoing. The spacer layer 1302 may be, for example, silicon nitride, some other suitable nitride(s), some other suitable dielectric(s), or any combination of the foregoing.

Figure 14:
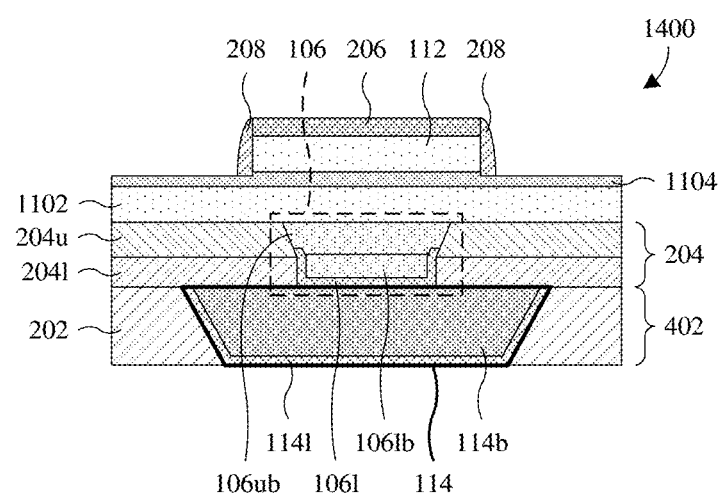

As illustrated by the cross-sectional view 1400 of FIG. 14, a fourth etch is performed into the spacer layer 1302 (see FIG. 13) to etch back the spacer layer 1302 and to form a spacer 208 from the spacer layer 1302. The spacer 208 comprises a pair of segments respectively on opposite sidewalls of the top electrode 112. Further, in some embodiments, the segments are respectively on opposite sidewalls of the hard mask 206, and/or the opposite sidewalls of the hard mask 206 are respectively even with the opposite sidewalls of the top electrode 112. In some embodiments, the spacer 208 extends laterally along sidewalls of the top electrode 112 in a closed path to completely enclose the top electrode 112. Note that this is not visible within the cross-sectional view 1400 of FIG. 14. A process for performing the fourth etch may comprise, for example, applying one or more etchants to the spacer layer 1302 to remove horizontal segments of the spacer layer 1302 without removing vertical segments of the spacer layer 1302, such that at least one of the vertical segments corresponds to the spacer 208.

Figure 15:
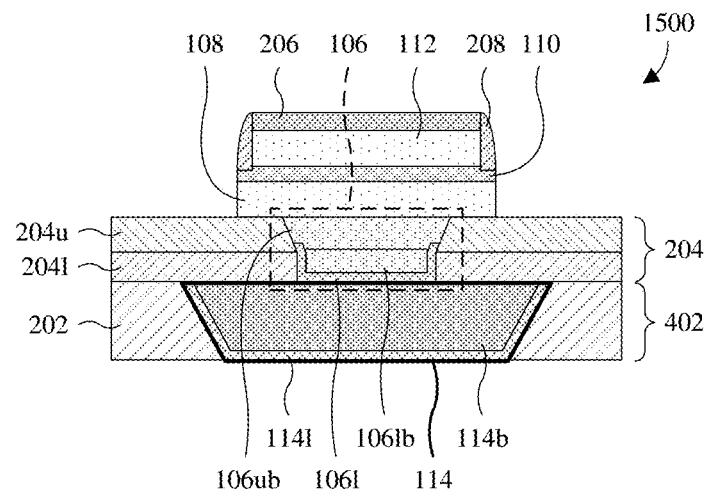

As illustrated by the cross-sectional view 1500 of FIG. 15, a fifth etch is performed into the data storage layer 1104 (see FIG. 14) and the bottom electrode layer 1102 (see FIG. 14) with the spacer 208 and the hard mask 206 in place to form a data storage element 110 and a bottom electrode 108. The data storage element 110 underlies the top electrode 112 and is formed from the data storage layer 1104. The bottom electrode 108 underlies the data storage element 110 and is formed from the bottom electrode layer 1102. A process for performing the fifth etch may comprise, for example, applying one or more etchants to the data storage layer 1104 and the bottom electrode layer 1102 until the BEVA dielectric layer 204 is reached by the etchant(s). The spacer 208 and the hard mask 206 collectively define a mask for the fifth etch, and the BEVA dielectric layer 204 serves as an etch stop.

Figure 16:
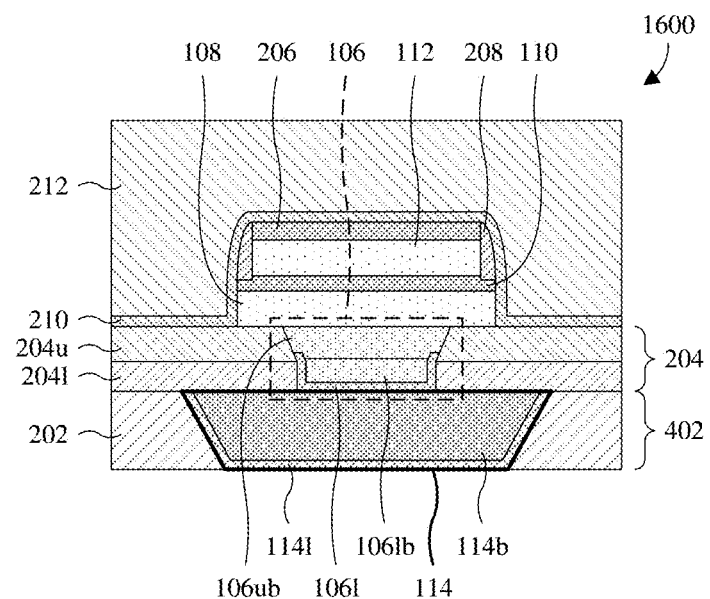

As illustrated by the cross-sectional view 1600 of FIG. 16, a capping layer 210 is formed covering the BEVA dielectric layer 204, the spacer 208, and the hard mask 206. Further, the capping layer 210 is formed lining sidewalls of the spacer 208, sidewalls of the data storage element 110, and sidewalls of the bottom electrode 108. The capping layer 210 may be or comprise, for example, silicon nitride, some other suitable nitride(s), some other suitable dielectric(s), or any combination of the foregoing. In some embodiments, the capping layer 210 is formed by conformal deposition, and/or is formed by CVD, PVD, some other suitable deposition process(es), or any combination of the foregoing.

Also illustrated by the cross-sectional view 1600 of FIG. 16, a device ILD layer 212 is formed covering the capping layer 210. Further, the device ILD layer 212 is formed with a top surface that is planar or substantially planar. The device ILD layer 212 may be or comprise, for example, silicon oxide, a low κ dielectric, some other suitable dielectric(s), or any combination of the foregoing. In some embodiments, a process for forming the device ILD layer 212 comprises depositing the device ILD layer 212 covering the capping layer 210, and subsequently performing a planarization into the top surface of the device ILD layer 212. The device ILD layer 212 may, for example, be deposited by CVD, PVD, sputtering, some other suitable deposition process(es), or any combination of the foregoing. The planarization may, for example, be performed by a CMP or some other suitable planarization process.

Figure 17:
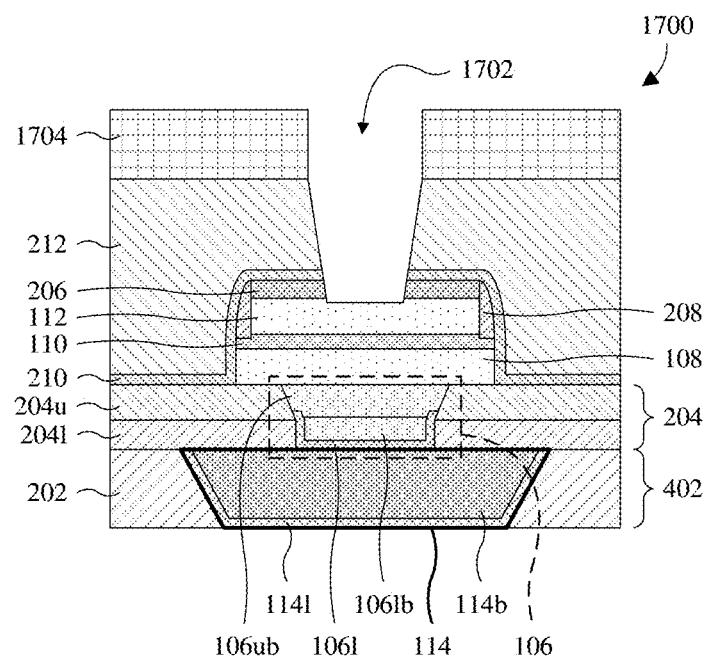

As illustrated by the cross-sectional view 1700 of FIG. 17, a sixth etch is performed into the device ILD layer 212, the capping layer 210, and the hard mask 206 to form a TEVA opening 1702 overlying and exposing the top electrode 112. In some embodiments, a process for performing the sixth etch comprises forming a photoresist mask 1704 on the device ILD layer 212. The photoresist mask 1704 may, for example, be formed by depositing a photoresist layer on the device ILD layer 212 and patterning the photoresist layer with a layout of the TEVA opening 1702. The depositing may, for example, be performed by spin coating or some other suitable deposition process, and/or the patterning may, for example, be performed by photolithography or some other suitable patterning process. One or more etchants are then be applied to the device ILD layer 212, the capping layer 210, and the hard mask 206 with the photoresist mask 1704 in place, and the photoresist mask 1704 is thereafter removed.

Figure 18:
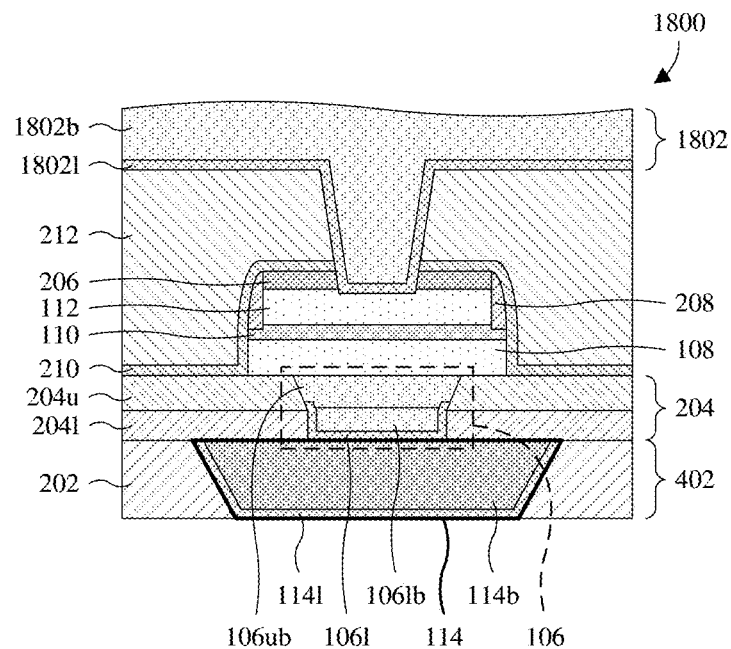

As illustrated by the cross-sectional view 1800 of FIG. 18, a TEVA layer 1802 is formed covering the device ILD layer 212 and filling the TEVA opening 1702 (see FIG. 17). The TEVA layer 1802 comprises a TEVA liner layer 1802*l* and a TEVA body layer 1802*b*. The TEVA liner layer 1802*l* covers the device ILD layer 212 and lines the TEVA opening 1702 so as to partially fill the TEVA opening 1702. In some embodiments, TEVA liner layer 1802*l* conformally lines the TEVA opening 1702. The TEVA body layer 1802*b* covers the TEVA liner layer 1802*l* and fills a remainder of the TEVA opening 1702 over the TEVA liner layer 1802*l*. The TEVA liner layer 1802*l* is a different material than the TEVA body layer 1802*b* and has a different hardness than the TEVA body layer 1802*b*. Further, the TEVA liner layer 1802*l* blocks material of the TEVA body layer 1802*b* from migrating to surrounding structure. The TEVA body layer 1802*b* may be or comprise, for example, tungsten, copper, aluminum copper, aluminum, some suitable other metal, or some other suitable conductive material. The TEVA liner layer 1802*l* may be or comprise, for example, titanium, tantalum, titanium nitride, tantalum nitride, or some other suitable barrier material for the TEVA body layer 1802*b*. The TEVA liner layer 1802*l* and the TEVA body layer 1802*b* may, for example, be formed by CVD, PVD, electroless plating, electroplating, some other suitable plating or deposition process(es), or any combination of the foregoing.

Figure 19:
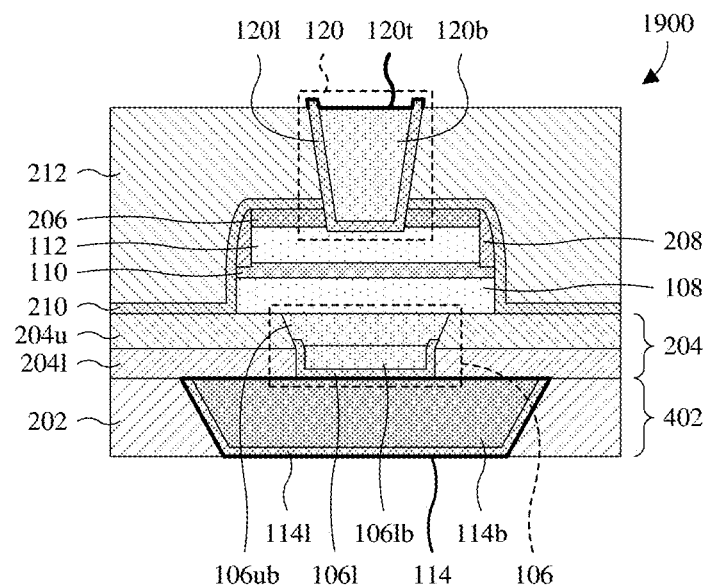

As illustrated by the cross-sectional view 1900 of FIG. 19, a third planarization is performed into a top of TEVA layer 1802 (see FIG. 18), including a top of the TEVA liner layer 1802*l* (see FIG. 18) and a top of the TEVA body layer 1802*b* (see FIG. 18), until the device ILD layer 212 is reached to form a TEVA 120 in the TEVA opening 1702 (see FIG. 17). The TEVA 120 comprises a TEVA body 120*b* and a TEVA liner 120*l*. The TEVA body 120*b* is formed from the TEVA body layer 1802*b*, and the TEVA liner 120*l* is formed from the TEVA liner layer 1802*l*. Further, the TEVA liner 120*l* cups an underside of the TEVA body 120*b* so as to line a bottom surface of the TEVA body 120*b* and sidewalls of the TEVA body 120*b*. The third planarization may, for example, be performed by a CMP or some other suitable planarization process.

Because the TEVA 120 is formed from both the TEVA liner layer 1802*l* and the TEVA body layer 1802*b*, and because the TEVA liner layer 1802*l* and the TEVA body layer 1802*b* are different materials, the TEVA 120 is heterogeneous (e.g., multiple materials) and has a top surface 120*t* that is heterogeneous. Further, because the TEVA liner layer 1802*l* and the TEVA body layer 1802*b* are different materials, the TEVA liner layer 1802*l* and the TEVA body layer 1802*b* have different hardnesses and, hence, different removal rates during the third planarization. Accordingly, the third planarization non-uniformly removes material from the TEVA liner layer 1802*l* and the TEVA body layer 1802*b*. This, in turn, forms the TEVA 120 so the top surface 120*t* of the TEVA 120 that is rough or uneven.

Figure 20:
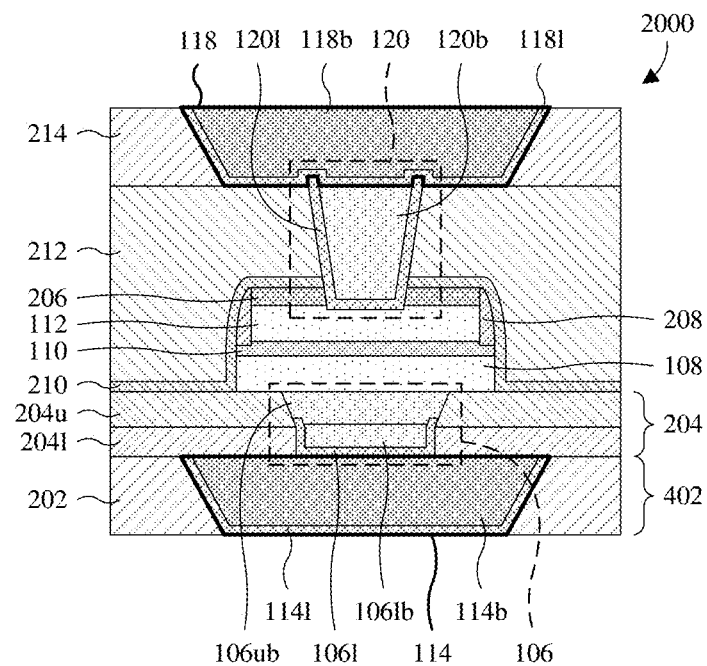

As illustrated by the cross-sectional view 2000 of FIG. 20, an upper ILD layer 214 and an upper wire 118 are formed on the device ILD layer 212 and the TEVA 120. The upper ILD layer 214 may be or comprise, for example, silicon nitride, silicon oxide, a low κ dielectric layer, some other suitable dielectric(s), or any combination of the foregoing. The upper wire 118 is recessed into a bottom of the upper ILD layer 214, such that a bottom surface of the upper wire 118 is even or substantially even with a bottom surface of the upper ILD layer 214. Further, the upper wire 118 overlies and is electrically coupled to the TEVA 120. The upper wire 118 may be or comprise, for example, titanium nitride, tantalum, tantalum nitride, titanium, aluminum, aluminum copper, copper, some other suitable conductive material(s), or any combination of the foregoing. In some embodiments, the upper wire 118 is heterogeneous (e.g., multiple materials) and comprises an upper wire body 118*b* and an upper wire liner 118*l*. The upper wire body 118*b* may be or comprise, for example, copper, aluminum copper, aluminum, or some other suitable conductive material. The upper wire liner 118*l* cups an underside of the upper wire body 118*b* and blocks material of the upper wire body 118*b* from migrating to surrounding structure. The upper wire liner 118*l* may be, for example, titanium, tantalum, titanium nitride, tantalum nitride, or some other suitable barrier material for the upper wire body 118*b*.

In some embodiments where the data storage element 110 corresponds to RRAM, a forming voltage is applied across the data storage element 110, from the bottom electrode 108 to the top electrode 112, to form one or more conductive filaments (not shown) in the data storage element 110. Examples of the conductive filament(s) are shown in FIG. 2 (see the conductive filaments 110*f* in FIG. 2).

Figure 21:
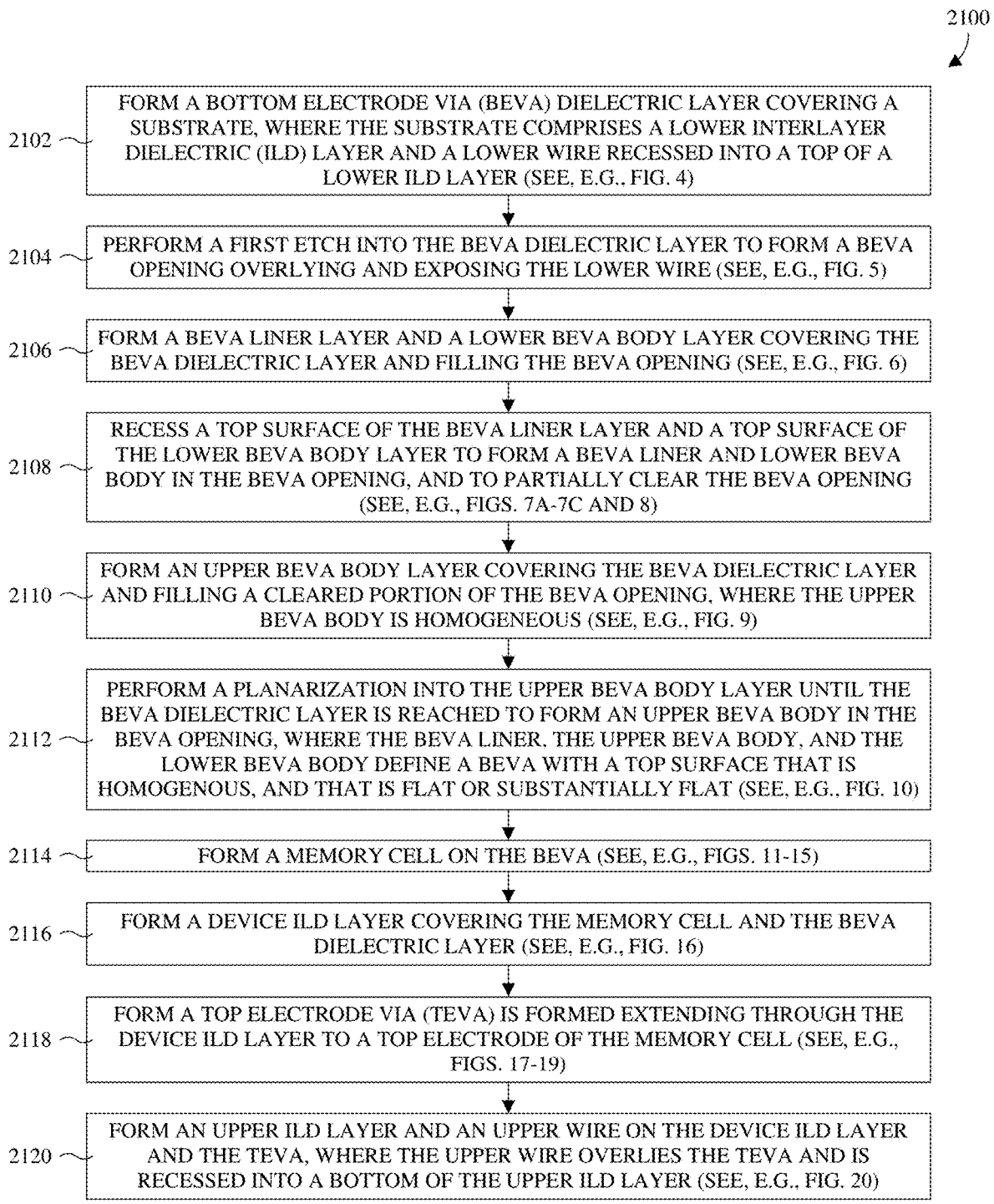
FIG. 21 illustrates a flowchart of some embodiments of the method of FIGS. 4-6, 7A-7C, 8-20.

With reference to FIG. 21, a flowchart 2100 of some embodiments of method of FIGS. 4-6, 7A-7C, 8-20 is provided.

At 2102, a BEVA dielectric layer is formed covering a substrate. See, for example, FIG. 4. The substrate comprises a lower ILD layer and a lower wire. The lower wire is recessed into a top of a lower ILD layer, such that a top surface of the lower wire is even or substantially even with a top surface of the lower ILD layer. The lower ILD layer and the lower wire may, for example, be components of a BEOL interconnect structure.

At 2104, a first etch is performed into the BEVA dielectric layer to form a BEVA opening overlying and exposing the lower wire. See, for example, FIG. 5.

At 2106, a BEVA liner layer and a lower BEVA body layer are formed covering the BEVA dielectric layer and filling the BEVA opening. See, for example, FIG. 6. The BEVA liner layer lines the BEVA opening to partially fill the BEVA opening, and the lower BEVA body layer fills a remainder of the BEVA opening over the BEVA liner layer. The lower BEVA body layer is conductive and, in some embodiments, homogeneous. The BEVA liner is conductive and blocks material of the lower BEVA body layer from migrating (e.g., diffusing) out of the BEVA opening.

At 2108, a top surface of the BEVA liner layer and a top surface of the lower BEVA body layer are recessed to form a BEVA liner and a lower BEVA body in the BEVA opening, and to partially clear the BEVA opening. See, for example, FIGS. 7A-7C and 8. The recessing may, for example, be performed by a planarization followed by an etch back.

At 2110, an upper BEVA body layer is formed covering the BEVA dielectric layer and filling a cleared portion of the BEVA opening. See, for example, FIG. 9. The upper BEVA body layer is homogeneous.

At 2112, a planarization is performed into the upper BEVA body layer until the BEVA dielectric layer is reached to form an upper BEVA body in the BEVA opening. See, for example, FIG. 10. The BEVA liner, the upper BEVA body, and the lower BEVA body define a BEVA with a top surface that is homogenous, and that is flat or substantially flat. The top surface of the BEVA is flat or substantially flat because the top surface is formed from the upper BEVA body layer. Namely, because the upper BEVA body layer is homogeneous, the upper BEVA body layer is removed at a uniform or substantially uniform rate during the planarization, thereby forming the top surface of the BEVA flat or substantially flat. Because the top surface of the BEVA is flat or substantially flat, an electric field produced using the BEVA is uniform or substantially uniform.

At 2114, a memory cell is formed on the BEVA. See, for example, FIGS. 11-15. The memory cell may be, for example, an RRAM cell, a MRAM cell, or some other suitable type of memory cell. In other embodiments, another type of electronic device is formed on the BEVA, such as, for example, a metal-insulator-metal (MIM) capacitor or some other suitable type of electronic device.

At 2116, a device ILD layer is formed covering the memory cell and the BEVA dielectric layer. See, for example, FIG. 16.

At 2118, a TEVA is formed extending through the device ILD layer to a top electrode of the memory cell. See, for example, FIGS. 17-19.

At 2120, an upper ILD layer and an upper wire are formed on the device ILD layer and the TEVA. See, for example, FIG. 20. The upper wire overlies the TEVA and is recessed into a bottom of the upper ILD layer, such that a bottom surface of the upper wire is even or substantially even with a bottom surface of the upper ILD layer. The upper ILD layer and the upper wire may, for example, be components of a BEOL interconnect structure.

While the flowchart 2100 of FIG. 21 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Therefore, in some embodiments, the present application is directed towards an integrated circuit including: a conductive wire; a via dielectric layer overlying the conductive wire; a via extending through the via dielectric layer to the conductive wire, wherein the via includes a conductive body and a conductive liner, wherein the conductive liner cups an underside of the conductive body and has a top surface recessed below a top surface of the via, and wherein the conductive body overhangs the top surface of the conductive liner and defines the top surface of the via; and a memory cell directly on the top surface of the via. In some embodiments, the top surface of the via extends continuously from a first sidewall of the via to a second sidewall of the via, wherein the first and second sidewalls of the via are on opposite sides of the via and directly contact the via dielectric layer. In some embodiments, the memory cell includes a bottom electrode, a data storage element overlying the bottom electrode, and a top electrode overlying the data storage element, wherein a bottom surface of the bottom electrode directly contacts the top surface of the via and a top surface of the via dielectric layer. In some embodiments, the conductive liner is continuous and directly contacts sidewalls of the via dielectric layer and sidewalls of the conductive body, wherein the conductive liner has an upper surface recessed below the top surface of the conductive liner, and wherein the conductive body directly contacts the top surface of the conductive liner and the upper surface of the conductive liner. In some embodiments, the conductive liner directly contacts the conductive wire. In some embodiments, the conductive liner blocks diffusion of material from the conductive body to the via dielectric layer and the conductive wire. In some embodiments, the via dielectric layer includes a lower dielectric layer and an upper dielectric layer overlying and directly contacting the lower dielectric layer, wherein a width of the via continuously decreases from the top surface of the via to an interface between the lower and upper dielectric layers, and wherein the width of the via is substantially uniform from the interface to the conductive wire. In some embodiments, the top surface of the via is homogeneous. In some embodiments, the conductive body includes copper, wherein the conductive liner includes titanium nitride, titanium, tantalum nitride, or tantalum.

In other embodiments, the present application is directed towards a method for forming an integrated circuit, the method including: performing an etch into a via dielectric layer to form an opening overlying and exposing a conductive wire underlying the via dielectric layer; forming a via liner layer covering the via dielectric layer and lining the opening, wherein the via liner layer partially fills the opening; forming a lower via body layer covering the via dielectric layer and filling a remainder of the opening over the via liner layer; recessing a top surface of the lower via body layer and a top surface of the via liner layer to below a top surface of the via dielectric layer to partially clear the opening, and to form a via liner and a lower via body in the opening; forming an upper via body layer covering the via dielectric layer, and filling a portion of the opening cleared by the recessing; and performing a planarization into the upper via body layer until the via dielectric layer is reached to form an upper via body in the opening. In some embodiments, the lower via body, the upper via body, and the via liner collectively define a via in the opening, wherein the upper via body completely defines a top surface of the via. In some embodiments, the upper via body layer is a single material. In some embodiments, the recessing includes: performing a second planarization into the top surface of the lower via body layer; and performing a second etch into the top surface of the lower via body layer and the top surface of the via liner layer to form the via liner and the lower via body. In some embodiments, the second planarization stops before reaching the via liner layer and the via dielectric layer, such that the via liner layer is covered by the lower via body layer outside the opening upon completion of the second planarization. In some embodiments, the second planarization stops on the via liner layer, before reaching the via dielectric layer, such that the via liner layer is uncovered by the lower via body layer outside the opening upon completion of the second planarization. In some embodiments, the second planarization stops on the via dielectric layer, wherein the top surface of the via liner layer is vertically offset from the top surface of the lower via body layer upon completion of the second planarization. In some embodiments, the second etch is performed using an etchant that etches the lower via body layer and the via liner layer at a faster rate than the via dielectric layer. In some embodiments, the via liner layer directly contacts sidewalls of the via dielectric layer in the opening, wherein the lower via body layer directly contacts the via liner layer and is spaced from the via dielectric layer by the via liner layer. In some embodiments, the upper via body layer directly contacts sidewalls of the via dielectric layer, sidewalls of the via liner, a top surface of the via liner, and a top surface of the lower via body in the opening.

In other embodiments, the present application is directed towards another integrated circuit including: a conductive wire; a via dielectric layer overlying the conductive wire; a via extending through the via dielectric layer to the conductive wire, wherein the via includes a conductive body and a conductive liner, wherein the conductive body includes a pair of first sidewalls and a pair of second sidewalls, wherein the first sidewalls are above the second sidewalls and are respectively on opposite sides of the via, wherein the second sidewalls are respectively on the opposite sides of the via, wherein the second sidewalls are laterally between and laterally spaced from the first sidewalls, and wherein the conductive liner extends continuously from a bottom edge of one of the first sidewalls, along the second sidewalls, to a bottom edge of another one of the first sidewalls; and a memory cell directly on the via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
a conductive wire;
a memory cell overlying the conductive wire; and
a via extending from the memory cell to the conductive wire and comprising a conductive body and a conductive liner, wherein the conductive liner has a top corner underlying the conductive body and elevated relative to a bottom surface of the conductive body, and wherein the conductive liner extends along the bottom surface and a sidewall of the conductive body.

2. The IC according to claim 1, wherein the conductive body fully covers the conductive liner in cross section.

3. The IC according to claim 1, further comprising:
a dielectric layer between the memory cell and the conductive wire, wherein the via extends through the dielectric layer and directly contacts the dielectric layer at a first location and a second location respectively on opposite sides of the via.

4. The IC according to claim 1, wherein the conductive liner has a U-shaped profile.

5. The IC according to claim 1, wherein the conductive body wraps around the top corner from a sidewall of the conductive liner to a top surface of the conductive liner.

6. The IC according to claim 1, wherein a width of the via is greater at a top surface of the via than at a bottom surface of the via.

7. The IC according to claim 1, wherein the conductive body consists essentially of a single material.

8. An integrated circuit (IC) comprising:
a conductive wire;
a memory cell overlying the conductive wire; and
a via extending from the memory cell to the conductive wire and comprising a conductive body and a conductive liner, wherein the conductive liner extends along a bottom surface of the conductive body and a first sidewall of the conductive body, and wherein the conductive liner and the conductive body define a common sidewall that is smooth and that is over and laterally offset from the first sidewall of the conductive body.

9. The IC according to claim 8, wherein a top edge of the common sidewall directly contacts the memory cell, and wherein a bottom edge of the common sidewall is elevated above the bottom surface of the conductive body.

10. The IC according to claim 8, wherein the common sidewall comprises a second sidewall of the conductive body and a first sidewall of the conductive liner, and wherein the second sidewall of the conductive body and the first sidewall of the conductive liner are arranged edge to edge.

11. The IC according to claim 8, wherein the common sidewall is laterally offset from the first sidewall of the conductive body in a direction away from a width-wise center of the via.

12. The IC according to claim 8, wherein a width of the conductive body is greater at a top surface of the via than at the bottom surface of the conductive body.

13. The IC according to claim 8, further comprising:
a dielectric layer between the memory cell and the conductive wire, wherein the common sidewall directly contacts the dielectric layer.

14. The IC according to claim 8, wherein the conductive body comprises a first material and a second material different than the first material, wherein a top surface of the conductive body consists essentially of the first material, and wherein a bottom surface of the conductive body consists essentially of the second material.

15. An integrated circuit (IC) comprising:
a conductive wire;
a via dielectric layer overlying the conductive wire;
a memory cell overlying the conductive wire and the via dielectric layer; and
a via extending through the via dielectric layer, from the memory cell to the conductive wire, and comprising a conductive body and a conductive liner, wherein the conductive body has a first sidewall and a top surface arranged edge to edge and respectively and directly contacting the via dielectric layer and the memory cell, wherein the top surface of the conductive body is a single material, and wherein the conductive liner wraps around a bottom corner of the conductive body from a second sidewall of the conductive body to a bottom surface of the conductive body.

16. The IC according to claim 15, wherein the conductive liner has a first sidewall directly contacting the via dielectric layer and arranged edge to edge with the first sidewall of the conductive body.

17. The IC according to claim 15, wherein the conductive body decreases in width from top to bottom.

18. The IC according to claim 15, wherein a bottom surface of the conductive liner directly contacts the conductive wire.

19. The IC according to claim 15, wherein the conductive body overhangs the conductive liner at a periphery of the via.

20. The IC according to claim 15, wherein the bottom surface of the conductive body is a single material that is the same as that at the top surface of the conductive body.

* * * * *